(12) United States Patent
Cao et al.

(10) Patent No.: US 9,234,702 B2
(45) Date of Patent: Jan. 12, 2016

(54) PREBAKE EQUIPMENT AND AIR DISCHARGE METHOD THEREOF

(71) Applicants: BOE Technology Group Co., Ltd., Beijing (CN); Hefei BOE Optoelectronics Technology Co., Ltd., Hefei (CN)

(72) Inventors: Xudong Cao, Beijing (CN); Seong Cho Lee, Beijing (CN); Dongdong Yin, Beijing (CN); Kun Li, Beijing (CN); Xinxiao Hua, Beijing (CN); Lifeng Wu, Beijing (CN); Chao Li, Beijing (CN); Wenxu Wang, Beijing (CN)

(73) Assignees: BOE TECHNOLOGY GROUP Co., Ltd., Beijing (CN); HEFEI BOE OPTOELECTRONICS TECHNOLOGY, Co., Ltd., Beijing (CN)

( * ) Notice: Subject to any disclaimer, the term of this patent is extended or adjusted under 35 U.S.C. 154(b) by 0 days.

(21) Appl. No.: 13/995,495

(22) PCT Filed: Nov. 9, 2012

(86) PCT No.: PCT/CN2012/084400
§ 371 (c)(1),
(2) Date: Jun. 18, 2013

(87) PCT Pub. No.: WO2013/174107
PCT Pub. Date: Nov. 28, 2013

(65) Prior Publication Data
US 2014/0047734 A1     Feb. 20, 2014

(30) Foreign Application Priority Data

May 21, 2012    (CN) .......................... 2012 1 0158972

(51) Int. Cl.
*F26B 25/06*    (2006.01)
*G03F 7/38*     (2006.01)
*F26B 21/06*    (2006.01)

(52) U.S. Cl.
CPC ................. *F26B 25/06* (2013.01); *F26B 21/06* (2013.01); *G03F 7/38* (2013.01)

(58) Field of Classification Search
CPC ............. G03F 7/38; G03F 7/40; F26B 21/06; F26B 21/083; F26B 25/06; F26B 25/08; F26B 25/10; F26B 25/12; F26B 25/14; F26B 25/18; F26B 25/185; F26B 11/028; F26B 11/22; F26B 2210/14; F26B 2210/16; B05D 3/00; B05D 3/002; B05D 3/05; B05D 3/007; B05D 3/02; B05D 3/0236; B05D 3/0272; B05D 3/04; B05D 3/0406; B05D 3/0413; B05D 3/042; B05D 3/0426
USPC ........... 34/192, 238, 237, 235, 195, 197, 209, 34/210, 211, 215, 226, 227, 231, 232, 233, 34/486, 492, 572, 201, 202
See application file for complete search history.

(56) References Cited

U.S. PATENT DOCUMENTS 1,207,850 A *  12/1916  Bried ............................... 34/238
1,521,752 A *   1/1925  Chapman ........................ 34/238
(Continued)

FOREIGN PATENT DOCUMENTS

CN        1648792 A     8/2005
CN      201815456 U     5/2011
(Continued)

OTHER PUBLICATIONS

English abstract of Chinese patent CN 1648792 A (listed above), 2 pages.
(Continued)

*Primary Examiner* — Kenneth Rinehart
*Assistant Examiner* — Tavia Sullens

(57) ABSTRACT

A prebake equipment for drying a substrate (105) and an air discharge method, the prebake equipment comprising: a bottom plate (105), a periphery frame (101) and an upper cover plate, the bottom plate (105) and the upper cover plate being spaced from each other, the periphery frame (101) being provided between the bottom plate (105) and the upper cover plate such that the bottom plate (105), the periphery frame (101) and the upper cover plate define a cavity, wherein discharge holes are provided at the periphery frame (101) and a filler (104) for filtering moisture and dust in the air stream is provided between the bottom plate (105) and the periphery frame (101).

15 Claims, 2 Drawing Sheets

(56) References Cited

U.S. PATENT DOCUMENTS

| | | | | |
|---|---|---|---|---|
| 1,576,906 | A | * | 3/1926 | Greve .............................. 34/122 |
| 4,802,287 | A | * | 2/1989 | Chen ................................ 34/91 |
| 4,957,522 | A | * | 9/1990 | Brassell ............................ 96/4 |
| 5,351,417 | A | * | 10/1994 | Rubin .............................. 34/572 |
| 5,454,274 | A | * | 10/1995 | Zhu .............................. 73/863.12 |
| 5,497,563 | A | * | 3/1996 | Mayfield ......................... 34/572 |
| 5,899,001 | A | * | 5/1999 | Layton .............................. 34/82 |
| 6,656,838 | B2 | * | 12/2003 | Watanabe et al. ............. 438/758 |
| 6,824,595 | B2 | * | 11/2004 | Ueki et al. ....................... 96/154 |
| 7,875,864 | B2 | * | 1/2011 | Sogard ....................... 250/492.2 |
| 2002/0073628 | A1 | * | 6/2002 | Dextras ........................ 52/302.1 |
| 2003/0165756 | A1 | | 9/2003 | Ono et al. |
| 2005/0160574 | A1 | | 7/2005 | Bazin et al. |

FOREIGN PATENT DOCUMENTS

| | | | | |
|---|---|---|---|---|
| CN | 202003139 | U | 10/2011 | |
| CN | 102707586 | A | 10/2012 | |
| CN | 102708816 | A | 10/2012 | |
| JP | 58102548 | A | * 6/1983 | .............. H01L 23/46 |
| JP | 03228297 | A | 10/1991 | |
| JP | 1174188 | A | 3/1999 | |
| JP | 2000091185 | A | 3/2000 | |

OTHER PUBLICATIONS

English abstract of Japanese patent application No. 02-024094, Publication No. 03-228297 (listed above), 1 page.
English abstract of Chinese patent CN 102708816 A (listed above), 1 page.
International Search Report issued by the International Searching Authority on Feb. 29, 2013, 12 pages.
PCT International Preliminary Report on Patentability in International Patent Application No. PCT/CN2012/084400, dated Nov. 25, 2014; 10 pages.
First Office Action of the State Intellectual Property Office of the People's Republic of China in Chinese application No. CN20121015892.4, issued Mar. 5, 2013; 3 pages.
English Translation of First Office Action of the State Intellectual Property Office of the People's Republic of China in Chinese application No. CN20121015892.4, issued Mar. 5, 2013; 4 pages.
PCT International Search Report in International Patent Application No. PCT/CN2012/084400, dated Sep. 11, 2012; 10 pages.
English Abstract of CN201815456U; 1 page.
English Abstract of CN202003139U; 1 page.
English Abstract of CN102707586A; 1 page.
English language translation of JP1174188A; 17 pages.
English language translation of JP2000091185A; 13 pages.

* cited by examiner

PREBAKE EQUIPMENT AND AIR DISCHARGE METHOD THEREOF

CROSS REFERENCE TO RELATED APPLICATIONS

This application is based on International Application No PCT/CN2012/084400 filed on Nov. 9, 2012, which claims priority to Chinese National Application No. 201210158972.4, filed on May 21, 2012, the contents of which are incorporated herein by reference.

TECHNICAL FIELD

The present invention relates to a prebake equipment and an air discharge method thereof.

BACKGROUND

In the color filter process of thin film transistor liquid crystal display (TFT-LCD), after applying the photoresist with a coating machine, a prebake equipment is usually used to further remove the solvent for the photoresist and enhance the adhesive force between photoresist and substrate, so as to avoid the defect in the exposure area resulted from the detachment of the film due to the insufficient adhesive force when developing. During the operating process of the prebake equipment, organic sublimates will be generated within the cavity of the prebake equipment, resulting in an increase of the particles inside the cavity which will influence the quality of the products. Therefore it is necessary to discharge air from the cavity during the operating process so as to improve the rate of good product and facilitate the maintenance of the equipment.

In the prior art, in an prebake equipment without a hot air system, the air discharge is generally performed after the termination of the operating process, resulting in a short discharge time and a limited removal rate of organic sublimates from the cavity, and a big gap in the effect of sublimates removal as compared to air discharge during the operating process (an removal ratio in the air discharge during the operating process to that not during the operating process is generally above 14).

To improve the effect of air discharge, prior art usually needs an additionally mounted hot air system, adopts clean dry air (CDA) as air source, and heats the air by using a heating unit, so as to achieve an air discharge during the operating process. Although such a method has a good effect for removing sublimates, the cost for equipments is increased (for example, ducts and the heating unit), the energy consumption of hot air system (electrical energy and air) is large and it is very inconvenient for daily maintenance of the equipment.

SUMMARY

An embodiment of the invention provides a prebake equipment for drying a substrate, comprising: a bottom plate, a periphery frame and an upper cover plate, the bottom plate and the upper cover plate being spaced from each other, the periphery frame being provided between the bottom plate and the upper cover plate such that the bottom plate, the periphery frame and the upper cover plate define a cavity, wherein discharge holes are provided in the periphery frame and a filler for filtering moisture and dust in the air stream is provided between the bottom plate and the periphery frame.

Another embodiment of the invention provides a discharge method for the prebake equipment described above, comprising: using a fan to force air outside the prebake equipment to be drawn into the cavity through the filler, and discharge the air inside the cavity out of the cavity through the discharge holes.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and do not tend to limit the invention.

DETAILED DESCRIPTION

An embodiment of the invention provides a structure of prebake equipment, to overcome the defect of increased cost caused by using hot air system to obtain clean dry air (CDA) for air discharging in prebake process in the prior art. In this structure of prebake equipment, filler is used to filter moisture and dust in the air, such that the air in a clean room may be used directly for air discharging during the prebake process, therefore the equipment cost and the maintenance cost may be reduced, and the effect of discharge in prebake process can be improved at a relatively low cost.

The technical solutions of the embodiment will be described in a clearly and fully understandable way in connection with the drawings. Obviously, the described embodiments are just some of rather than all of the embodiments of the invention. Based on the described embodiments herein, those skilled in the art can obtain other embodiment(s) without any inventive work, which should be within the scope of the invention.

Figure 1:
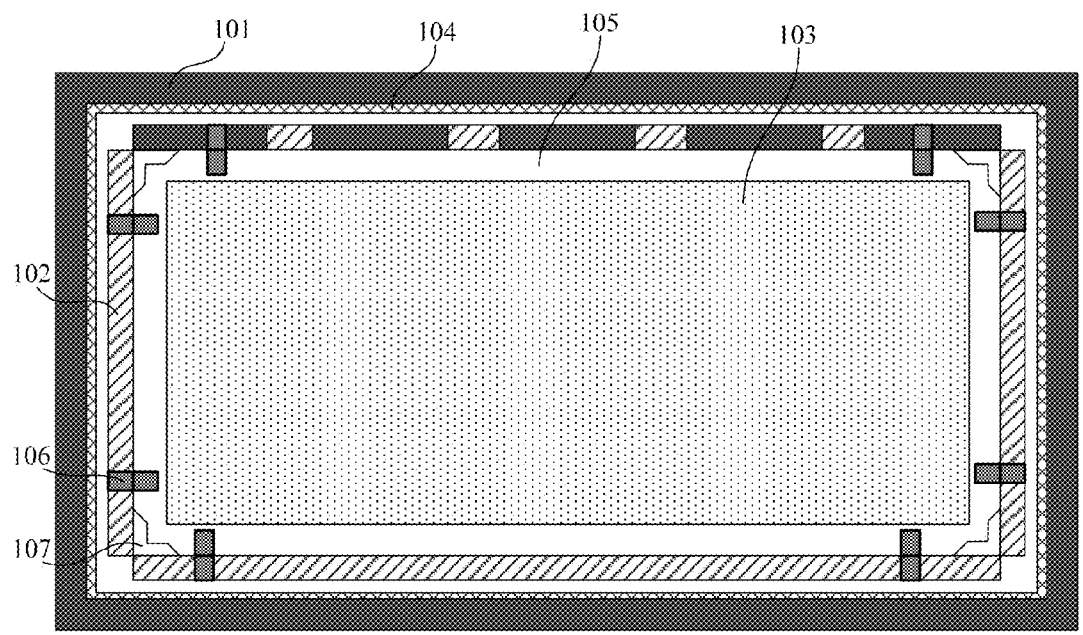
FIG. 1 is a top view of a prebake equipment of an embodiment of the invention.
Figure 2:
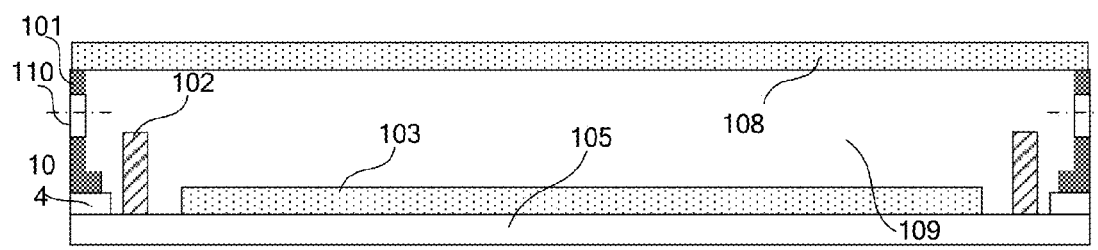
FIG. 2 is a sectional view of a prebake equipment of an embodiment of the invention.

The prebake equipment provided by an embodiment of the invention is applied to dry a substrate, which may be a color filter substrate. With reference to FIGS. 1 and 2, FIG. 1 is a top view of a prebake equipment and FIG. 2 is a sectional view thereof. As shown in figures, the prebake equipment described in the embodiment of the invention may comprise: a bottom plate 105, periphery frame 101 and an upper cover plate 108. The bottom plate 105, for example, is spaced from the upper cover plate 108 by a distance and opposites to the upper cover plate. The periphery frame 101 is provided between the bottom plate 105 and the upper cover plate 108, such that the bottom plate 105, the periphery frame 101 and the upper cover plate 108 define a cavity 109. The bottom plate 105 functions to generate heat, so as to dry a substrate disposed thereon, for example, the upper end of the periphery frame 101 is provided with air discharge holes 110, i.e. the end of the periphery frame 101 close to the upper cover plate 108 is provided with discharge holes.

A filler 104 used to filter moisture and dust in air stream is filled between the bottom plate 105 and the periphery frame 101. The filler 104 may use various existing materials in the prior art which can filter foreign materials in the air, for example, preferably GORE-TEX™ thin film may be used, the material of which is polytetraflouroethylene (PTFE), which has good performance of waterproof and air permeability.

An inner frame 102 with a predefined height is provided on the bottom plate 105. The inner frame 102 is located inside the cavity and defines an area for placing a substrate 103 on the bottom plate 105.

The height of the inner frame 102 is, for example, greater than the thickness of the substrate, such that the air stream entering the cavity via the filler climbs up the predefined height before passing over the substrate and finally discharge through the discharge holes. Thus, the defects in film surface caused by the direct contact of the cool air entering from outside with the substrate may be avoided or reduced by raising the air flow surface.

In FIG. 1, the periphery frame 101 is of, for example, a rectangle shape, and the discharge holes are, for example, provided on at least one side of the rectangle, for example, provided on two opposite shorter sides of the rectangle. The discharge holes may be connected to the external ducts to discharge air through the ducts.

In FIG. 1, the cavity formed by the bottom plate 105, the periphery frame 101 and the upper cover plate is of a cuboid shape, and the inner frame 102 is a rectangle frame assembled by four inner frame sections. Small connection clearance may exist between two adjacent inner frame sections. To avoid a direct entrance of the external air into the cavity through the clearance, in the embodiment of the invention, for example, four L-shaped baffles 107 are disposed against the four inner corners of the rectangle frames respectively, for blocking the entrance of the air stream into the cavity from the connection clearance between two adjacent inner frame sections.

Figure 3:
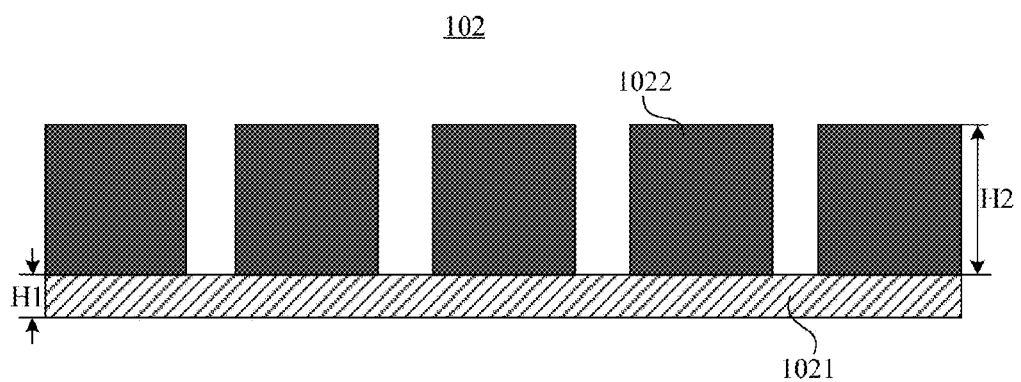
FIG. 3 is a structure schematic view of inner frame of an embodiment of the invention.

With reference to FIG. 1 and FIG. 3, in the four inner frame sections in the embodiment of the invention, one of the frame sections faces directly the entry direction of the substrate, i.e., when the substrate is fed in by a robot arm, the substrate enters from above the frame. To cooperate with the feed action of the robot arm, a special structure may be provided at this section of the frame, as shown in FIG. 3, this frame comprises:
 a frame section body 1021 in a strip shape; and
 a plurality of projecting platform 1022 located on the frame section body 1021 and spaced from each other with a gap formed between adjacent projecting platforms 1022, the gap corresponding to a robot arm for feeding the substrate.

For example, the frame section body 1021 has a height H1 of, for example, 6 mm, and the projecting platforms 1022 have a height H2 of, for example, 19 mm, thereby forming a "city wall" type structure with two heights of 25 mm and 6 mm, which can cooperate with the robot arm to avoid the interference between the frame structure and the robot arm, so as to enhance the stability of the substrate feeding.

In this embodiment, the inner frame may be made of stainless steel material, for example, stainless steel material of gauge SUS 304, which has a moderate price, good material stability, small thermal deformation, and corrosion resistance (the temperature inside the cavity is about 90 degree and an chemical change space exists within the cavity).

Figure 4:
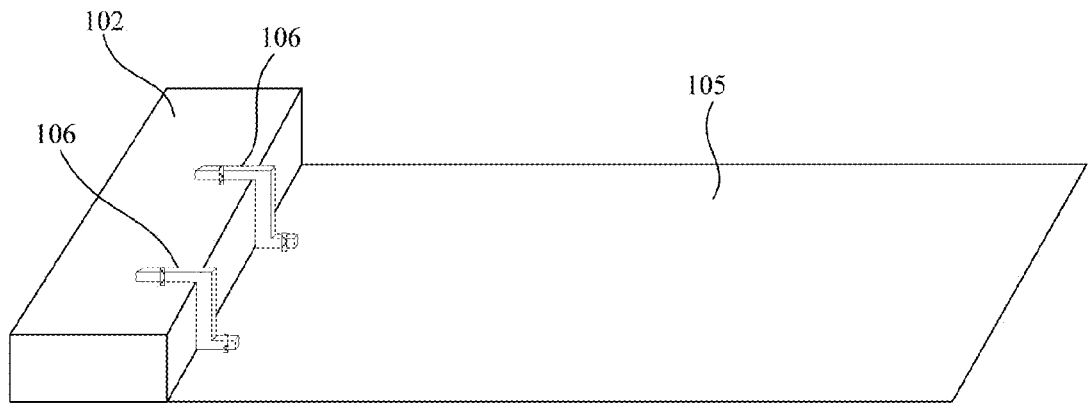
FIG. 4 is a schematic view of a connection relationship of inner frame of an embodiment of the invention.

With continued reference to FIG. 4, each of the inner frame sections may be fixed to the bottom plate 105 by two fixing mechanisms 106 having a Z-like shape. For example, a bottom end of the fixing mechanism 106 is fully-fixedly connected to the bottom plate 105, and a top end of the fixing mechanism 106 is semi-fixedly connected to an upper surface of the inner frame, to reserve a sufficient space for the thermal expansion and contraction of the inner frame section. The semi-fixed connection may be, for example, bolt connection having certain movement clearance.

It can be seen from above, the prebake equipment in the embodiment of the invention uses the filler 104 to dry and filter air, such that the external air (such as air in a clean room) may be used directly as a discharge air source for air discharging during the prebake process. Therefore, no additional hot air system is required, and good effect of removing sublimates may be achieved at low equipment and energy consumption cost with improved rate of good product and simplified equipment maintenance. Moreover, in the embodiment of the invention, the inner frame with a predefined height is used to force the air stream entering the cavity to climb up to a certain height, and thus defects in film surface caused by direct contact of the entered cool air with the substrate can be reduced or avoided.

Figure 5:
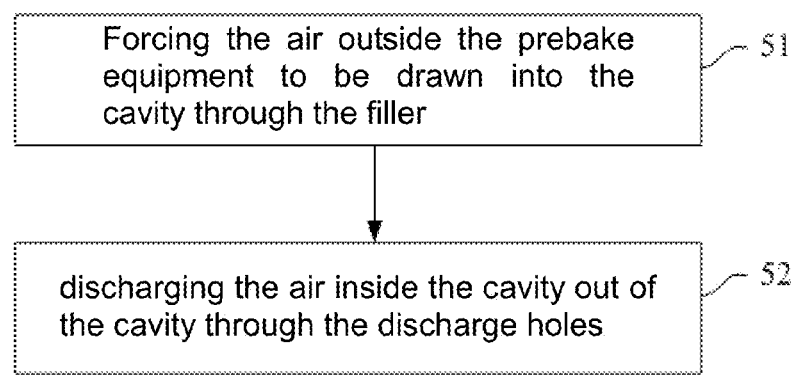
FIG. 5 is a schematic flowchart of discharge method of a prebake equipment of an embodiment of the invention.

The embodiment of the invention further provides a discharge method for the prebake equipment described above. As shown in FIG. 5, the method comprises the following steps:
 step 51, drawing air outside the prebake equipment into the cavity through the filler; and
 step 52, discharging the air inside the cavity out of the cavity through the discharge holes.

By the above steps, the embodiment of the invention achieves an air discharge during prebake process. Here, the power source may be a fan power, which is used to draw air into the cavity and discharge air out of the cavity. The discharge time may be during the prebake process, even lasting until a predefined time after the termination of the prebake process. Thus, the embodiment of the invention can both achieve the air discharge during prebake process and continue the air discharge after the termination of prebake process. The length of the predefined time herein may be self-set, for example, may be set as less than 20 seconds, preferably, 4 to 16 seconds. Since the discharge of some photoresist after the termination of the prebake process may result in defects, when prebake process is performed for such photoresist, for example, the fan is activated to discharge air only during the prebake process.

According to the above description, the embodiment according to the invention may at least provide the following structure and method:

(1) A prebake equipment for drying a substrate, comprising:
 a bottom plate, a periphery frame and an upper cover plate, the bottom plate and the upper cover plate being spaced from each other, the periphery frame being provided between the bottom plate and the upper cover plate, such that the bottom plate, the periphery frame and the upper cover plate define a cavity, wherein discharge holes are provided in the periphery frame; and a filler for filtering moisture and dust in air stream is filled between the bottom plate and the periphery frame.

(2) the prebake equipment according to (1), wherein an inner frame with a predefined height is provided on the bottom plate, the inner frame is located inside the cavity and defines an area for placing the substrate on the bottom plate; the discharge holes are provided at the upper end of the periphery frame, and
 wherein the predefined height is greater than the thickness of the substrate, such that air stream entering the cavity through the filler climbs up the predefined height before passing over the substrate and is discharged through the discharge hole.

(3) the prebake equipment according to (1) or (2), wherein the filler is a GORE-TEX™ thin film.

(4) the prebake equipment according to any one of (1) to (3), wherein
the cavity is of a rectangle-shape, and the inner frame is a rectangle frame assembled by four inner frame sections.

(5) the prebake equipment according to (4), further comprising:
four L-shaped baffles disposed respectively against four inner corners of the inner frame for blocking the entrance of the air stream into the cavity through connection clearance between two adjacent inner frame sections.

(6) the prebake equipment according to (4), wherein
the four sections of inner frame comprises a first inner frame section facing directly to the entrance direction of the substrate, and the first inner frame section comprises:
a frame section body in a strip shape;
a plurality of projecting platforms located on the frame section body and spaced from each other, and a gap formed between adjacent projecting platforms, the gap corresponding to a robot arm feeding the substrate.

(7) the prebake equipment according to (4), wherein
the inner frame sections are fixed to the bottom plate with a Z-shaped fixing mechanism, and wherein the fixing mechanism has an bottom end fully-fixedly connected to the bottom plate and an top end semi-fixedly connected to an upper surface of the inner frame.

(8) the prebake equipment according to (1) or (2), wherein
the periphery frame is of a rectangle shape and the discharge holes are provided on at least one edge of the rectangle shape.

(9) A discharge method for the prebake equipment according to any one of (1) to (8), the method comprising:
using a fan to force air outside the prebake equipment to be drawn into the cavity through the filler, and discharge the air inside the cavity out of the cavity through the discharge holes.

(10) the discharge method according to (9), wherein
the fan is activated only when the substrate is being prebake processed.

(11) the discharge method according to (9), wherein
the fan is activated during the process of prebake processing of the substrate and within a predefined time after the termination of the prebake processing.

(12) the discharge method according to (11), wherein the predefined time is within 20 seconds.

(13) the discharge method according to (12), wherein the predefined time is 4 to 16 seconds.

The invention has been described in the above description by general description and with reference to specific embodiments. It is obvious for a person skilled in the art that the embodiments of the present invention as described may have variations or modifications. Such variations or modifications should not be regarded as a departure from the spirit and natural of the invention, but are within the scope of the present invention as defined in the following claims.

The invention claimed is:

1. A prebake equipment for drying a substrate, comprising:
a bottom plate, a periphery frame and an upper cover plate, the bottom plate and the upper cover plate being spaced from each other, the periphery frame being provided between the bottom plate and the upper cover plate, such that the bottom plate, the periphery frame and the upper cover plate define a cavity, wherein discharge holes are provided at the upper end of the periphery frame;
a solid filler for filtering moisture and dust in an air stream is fixedly disposed between the periphery frame and the bottom plate and contacts the bottom plate; and
wherein an inner frame with a predefined height is provided on the bottom plate and contacts the bottom plate, the inner frame is located inside the cavity and defines an area for placing the substrate on the bottom plate;
wherein the predefined height is greater than the thickness of the substrate, such that the air stream entering the cavity through the filler climbs up a predefined height before passing over the substrate and is finally discharged through the discharge holes.

2. The prebake equipment according to claim 1, wherein the filler is a GORE-TEX™ thin film.

3. The prebake equipment according to claim 1, wherein
the periphery frame is of a rectangle shape and the discharge holes are provided in at least one edge of the rectangle shape.

4. The prebake equipment according to claim 1, wherein
the cavity is of a rectangle shape, and the inner frame is a rectangle frame which is disposed at the periphery of the substrate and assembled from four inner frame sections.

5. The prebake equipment according to claim 4, further comprising:
four L-shaped baffles disposed against the four inner corners of the inner frame respectively for blocking the entrance of the air stream into the cavity through a connection clearance between two adjacent inner frame sections.

6. The prebake equipment according to claim 4, wherein
the four inner frame sections comprise a first inner frame section, and the first inner frame section comprises:
a strip-shaped planar plate;
a plurality of projecting platforms located on the strip-shaped planar plate and spaced from one another, and a gap formed between adjacent projecting platforms.

7. The prebake equipment according to claim 4, wherein
the inner frame sections are fixed to the bottom plate with a Z-shaped fixing mechanism, and wherein the fixing mechanism has a bottom end connected to the bottom plate and a top end connected to an upper surface of the inner frame.

8. An air discharge method for the prebake equipment according to claim 1, the method comprising:
forcing air outside the prebake equipment to be drawn into the cavity through the filler, and discharging the air inside the cavity out of the cavity through the discharge holes.

9. A prebake equipment for drying a substrate, comprising:
a bottom plate and an upper cover plate, the bottom plate and the upper cover plate being spaced from each other;
a periphery frame disposed on the bottom plate, such that the bottom plate, the periphery frame and the upper cover plate define a cavity, wherein discharge holes are provided at the upper end of the periphery frame;
an inner frame disposed on the bottom plate and located inside the cavity, the inner frame defining an area for placing the substrate on the bottom plate; and
a solid filler for filtering moisture and dust in an air stream is disposed on the bottom plate and filled between the bottom plate and the periphery frame;
wherein a wall formed from the periphery frame and the filler is disposed at the periphery of the inner frame, the inner frame is disposed at the periphery of the substrate;
a predefined height of the inner frame is greater than the thickness of the substrate, such that the air stream entering the cavity through the filler climbs up the predefined height before passing over the substrate and is finally discharged through the discharge holes.

10. The prebake equipment according to claim 9, wherein the filler is a GORE-TEX™ thin film.

11. The prebake equipment according to claim 9, wherein the periphery frame is of a rectangle shape and the discharge holes are provided in at least one edge of the rectangle shape.

12. The prebake equipment according to claim 9, wherein the cavity is of a rectangle shape, and the inner frame is a rectangle frame assembled by four inner frame sections.

13. The prebake equipment according to claim 12, further comprising:
four L-shaped baffles disposed against the four inner corners of the inner frame respectively for blocking the entrance of the air stream into the cavity through connection clearance between two adjacent inner frame sections.

14. The prebake equipment according to claim 12, wherein the four inner frame sections comprise a first inner frame section, and the first inner frame section comprises:
a strip-shaped planar plate;
a plurality of projecting platforms located on the strip-shaped planar plate and spaced from one another, and a gap formed between adjacent projecting platforms.

15. The prebake equipment according to claim 12, wherein the inner frame sections are fixed to the bottom plate with a Z-shaped fixing mechanism, and wherein the fixing mechanism has a bottom end connected to the bottom plate and a top end connected to an upper surface of the inner frame.

* * * * *